US011830569B2

(12) United States Patent
Chi

(10) Patent No.: US 11,830,569 B2
(45) Date of Patent: *Nov. 28, 2023

(54) READOUT CIRCUIT, MEMORY, AND METHOD OF READING OUT DATA OF MEMORY

(71) Applicant: CHANGXIN MEMORY TECHNOLOGIES, INC., Hefei (CN)

(72) Inventor: Sungsoo Chi, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

This patent is subject to a terminal disclaimer.

(21) Appl. No.: 18/153,431

(22) Filed: Jan. 12, 2023

(65) Prior Publication Data

US 2023/0154503 A1 May 18, 2023

Related U.S. Application Data

(63) Continuation of application No. PCT/CN2022/111197, filed on Aug. 9, 2022.

(30) Foreign Application Priority Data

Nov. 15, 2021 (CN) .......................... 202111350074.4

(51) Int. Cl.
*G11C 7/00* (2006.01)
*G11C 7/06* (2006.01)
(Continued)

(52) U.S. Cl.
CPC ............ *G11C 7/067* (2013.01); *G11C 7/1069* (2013.01); *G11C 7/12* (2013.01)

(58) Field of Classification Search
CPC ...................................................... G11C 7/067
(Continued)

(56) References Cited

U.S. PATENT DOCUMENTS 7,570,529 B2  8/2009  Kim et al.
10,224,093 B2  3/2019  Kim et al.
(Continued)

FOREIGN PATENT DOCUMENTS

CN    101241749 A    8/2008
CN    108257631 A    7/2018
(Continued)

OTHER PUBLICATIONS

International Search Report cited in PCT/CN2022/111197 dated Oct. 28, 2022, 15 pages.
(Continued)

*Primary Examiner* — Hoai V Ho
(74) *Attorney, Agent, or Firm* — Cooper Legal Group, LLC

(57) ABSTRACT

The present disclosure provides a readout circuit, a memory, and a method of reading out data of a memory. The readout circuit includes: a sense amplifier and an isolation unit, the sense amplifier being connected to a bit line and a complementary bit line through the isolation unit, the bit line being connected to a memory cell and the complementary bit line being connected to a memory cell, and the isolation unit being configured to disconnect the sense amplifier from the bit line and the complementary bit line in response to an isolation signal; and an offset canceling unit, configured to perform an offset cancellation on the sense amplifier in response to an offset canceling signal, at least a part of a stage of a charge sharing being performed at the same time as at least a part of a stage of an operation of the offset canceling unit.

15 Claims, 18 Drawing Sheets

(51) Int. Cl.
   *G11C 7/10* (2006.01)
   *G11C 7/12* (2006.01)
(58) Field of Classification Search
   USPC .................................................. 365/205, 206
   See application file for complete search history.

(56) References Cited

U.S. PATENT DOCUMENTS

| | | | |
|---|---|---|---|
| 10,535,388 B1 | 1/2020 | Ingalls | |
| 10,692,565 B2 | 6/2020 | Kim et al. | |
| 10,803,925 B2 | 10/2020 | Kim et al. | |
| 10,902,889 B2 | 1/2021 | Oak | |
| 11,024,365 B1 | 6/2021 | Seo et al. | |
| 11,581,034 B1 * | 2/2023 | Chi | G11C 7/06 |
| 11,594,264 B1 * | 2/2023 | Chi | G11C 11/4094 |
| 2011/0133809 A1 * | 6/2011 | Goel | G11C 11/4091 |
| | | | 327/307 |
| 2018/0182449 A1 | 6/2018 | Kim et al. | |
| 2020/0027490 A1 | 1/2020 | Ingalls | |
| 2020/0312385 A1 * | 10/2020 | Oak | G11C 7/12 |

FOREIGN PATENT DOCUMENTS

| | | |
|---|---|---|
| CN | 111081296 A | 4/2020 |
| CN | 111739566 A | 10/2020 |
| CN | 111863052 A | 10/2020 |
| CN | 112767975 A | 5/2021 |

OTHER PUBLICATIONS

International Search Report cited in PCT/CN2022/088090 dated Aug. 3, 2022, 9 pages.

* cited by examiner

--Prior Art--

READOUT CIRCUIT, MEMORY, AND METHOD OF READING OUT DATA OF MEMORY

CROSS-REFERENCE TO RELATED APPLICATIONS

This is a continuation of International Application No. PCT/CN2022/111197, filed on Aug. 9, 2022, which claims the priority to Chinese Patent Application 202111350074.4, titled "READOUT CIRCUIT, MEMORY, AND METHOD OF READING OUT DATA OF MEMORY" and filed on Nov. 15, 2021. The entire contents of International Application No. PCT/CN2022/111197 and Chinese Patent Application 202111350074.4 are incorporated herein by reference.

TECHNICAL FIELD

The present disclosure relates to, but is not limited to, a readout circuit, a memory, and a method of reading out data of a memory.

BACKGROUND

A semiconductor memory device is typically arranged in a large two-dimensional array of memory cells. The memory cells in each row may be selected by word lines (WLs), and the memory cells in each column may be selected by bit lines (BLs). The memory cells located at the intersections of the WLs and the BLs are configured to store corresponding information. A sense amplifier is a functional device that may be applied to a semiconductor memory. Turning on the sense amplifier at a suitable time point may amplify weak signals in the memory cells of the memory, such that data stored in the memory cells may be correctly written or read. Since the sense amplifier can accurately determine information stored in the memory cells, it is widely applied to various memory devices, such as a dynamic random access memory (DRAM), for reading the information stored in the memory cells. Pursuing a higher access speed of the semiconductor memory is one of the development directions of the semiconductor memory. However, the sense amplifier in the conventional semiconductor memory still have many limiting factors in terms of the speed and the utilization efficiency of memory arrays, which need to be further improved.

RAS-to-CAS delay (TRCD) is the minimum number of clock cycles required by the DRAM from accessing the memory cells at row addresses to accessing the memory cells at column addresses. Reducing the TRCD may provide more time margins for the memory device, thereby greatly increasing the read speed of the DRAM.

SUMMARY

An overview of the subject described in detail in the present disclosure is provided below. This overview is not intended to limit the protection scope of the claims.

The present disclosure provides a readout circuit, a memory, and a method of reading out data of a memory.

A first aspect of the present disclosure provides a readout circuit. The readout circuit includes a sense amplifier and an isolation unit, the sense amplifier being connected to a bit line and a complementary bit line through the isolation unit, the bit line being connected to a memory cell and the complementary bit line being connected to a memory cell, and the isolation unit being configured to disconnect the sense amplifier from the bit line and the complementary bit line in response to an isolation signal; and an offset canceling unit, configured to perform an offset cancellation on the sense amplifier in response to an offset canceling signal, at least a part of a stage of a charge sharing between the bit line and the memory cell or the complementary bit line and the memory cell being performed at the same time as at least a part of a stage of an operation of the offset canceling unit.

A second aspect of the present disclosure provides a memory, including the readout circuit according to the first aspect of the present disclosure.

A third aspect of the present disclosure provides a method of reading out data of a memory, including the readout circuit according to the first aspect of the present disclosure. The method of reading out data includes:

controlling an isolation unit to disconnect a sense amplifier from a bit line and a complementary bit line; and controlling an offset canceling signal to be valid in a period of disconnecting the sense amplifier from the bit line and the complementary bit line, such that at least a part of a stage of a charge sharing between the bit line and a memory cell or the complementary bit line and a memory cell is performed at the same time as at least a part of a stage of an offset cancelling.

Other aspects of the present disclosure are understandable upon reading and understanding of the accompanying drawings and detailed description.

BRIEF DESCRIPTION OF THE DRAWINGS

The accompanying drawings incorporated into the specification and constituting a part of the specification illustrate the embodiments of the present disclosure, and are used together with the description to explain the principles of the embodiments of the present disclosure. In these accompanying drawings, similar reference numerals represent similar elements. The accompanying drawings in the following description illustrate some rather than all of the embodiments of the present disclosure. Those skilled in the art may obtain other accompanying drawings based on these accompanying drawings without creative efforts.

Figure 1:
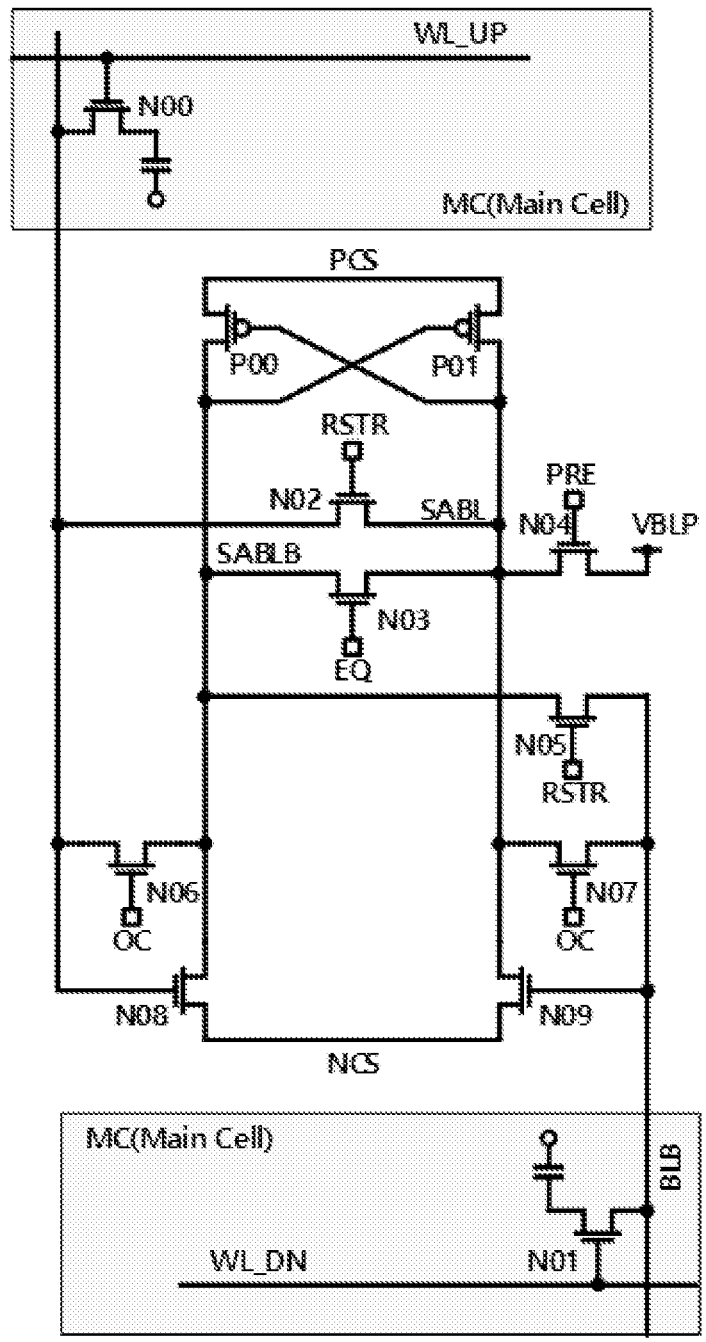
FIG. 1 is a schematic structural diagram of a control circuit of a sense amplifier in the prior art.

Descriptions of signals/signal lines in the accompanying drawings:

EQ-Bit line equalization signal; PRE-Precharge signal; RSTR-Bit line restore signal; OC-Offset canceling signal; WL_#-Word line enable signal; PCS-Positive power supply line; NCS-Negative power supply line; BL/BLB-Bit line/Complementary bit line; A-First connecting point; B-Second connecting point; SABL-First readout bit line; and ISABL-Second readout bit line.

DETAILED DESCRIPTION

The technical solutions in the embodiments of the present disclosure are described below clearly and completely with reference to the accompanying drawings in the embodiments of the present disclosure. Apparently, the described embodiments are merely some rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

The sense amplifier typically includes a first type of transistors (e.g., P-channel metal oxide semiconductor (MOS) transistors), namely a first transistor P00 and a second transistor P01, and a second type of transistors (e.g., N-channel MOS transistors), namely a third transistor N08 and a fourth transistor N09. A first source of the first transistor P00 and a first source of the third transistor N08 are connected in series between a positive power supply line PCS and a negative power supply line NCS. A first source of the second transistor P01 and a first source of the fourth transistor N09 are connected in series between the positive power supply line PCS and the negative power supply line NCS. The first transistor P00 and the second transistor P01 are cross-coupled to each other. A gate of the third transistor N08 and a gate of the fourth transistor N09 are respectively connected to a bit line BL and a complementary bit line BLB on both sides, and the third transistor N08 and the fourth transistor N09 are respectively turned on or turned off in response to the change of a level on the bit line BL and the change of a level on the complementary bit line BLB. The sense amplifier is separately connected to two memory cells through the bit line BL and the complementary bit line BLB, to write or read contents in the memory cells of a DRAM.

The sense amplifier further includes a series of operations in other stages, such as operations in a stage of offset cancelling, a stage of charge sharing, a stage of restoring, and a stage of precharge. When the operations in the stage of offset cancelling are added thereto, the length of a TRCD is increased. The TRCD is a cycle required by the DRAM from accessing the memory cells at row addresses to accessing the memory cells at column addresses. The increase in the length of the TRCD may have a greater impact on the read speed of the memory.

FIG. 1 is a schematic structural diagram of a control circuit of a sense amplifier in the prior art. The sense amplifier includes a first transistor P00, a second transistor P01, a third transistor N08, and a fourth transistor N09. The first transistor P00 and the second transistor P01 as well as the third transistor N08 and the fourth transistor N09 are different types of transistors. For example, the first transistor and the second transistor may be P-channel MOS transistors, and the third transistor and the fourth transistor may be N-channel MOS transistors. A first source of the first transistor P00 and a first source of the third transistor N08 are connected in series between a positive power supply line PCS and a negative power supply line NCS. A first source of the second transistor P01 and a first source of the fourth transistor N09 are connected in series between the positive power supply line PCS and the negative power supply line NCS. The first transistor P00 and the second transistor P01 are cross-coupled to each other. A gate of the third transistor N08 and a gate of the fourth transistor N09 are respectively connected to a bit line BL and a complementary bit line BLB of two memory cells. A connecting point for connecting the first transistor P00 and the third transistor N08 in series is defined as a first connecting point A, and a connecting point for connecting the second transistor P01 and the fourth transistor N09 in series is defined as a second connecting point B.

The sense amplifier is connected between the two memory cells through the bit line BL and the complementary bit line BLB, to write or read the contents in the memory cells of the DRAM. In the DRAM, each memory cell includes a word line WL and a bit line BL, and matrix transistors (such as N00 and N01 in FIG. 1) connected to the word line and the bit line. The gate of the third transistor N08 and the gate of the fourth transistor N09 are respectively connected to the bit line BL and the complementary bit line BLB on both sides, where the bit line BL and the complementary bit line BLB are respectively bit lines in the two memory cells in the embodiments.

Figure 2:
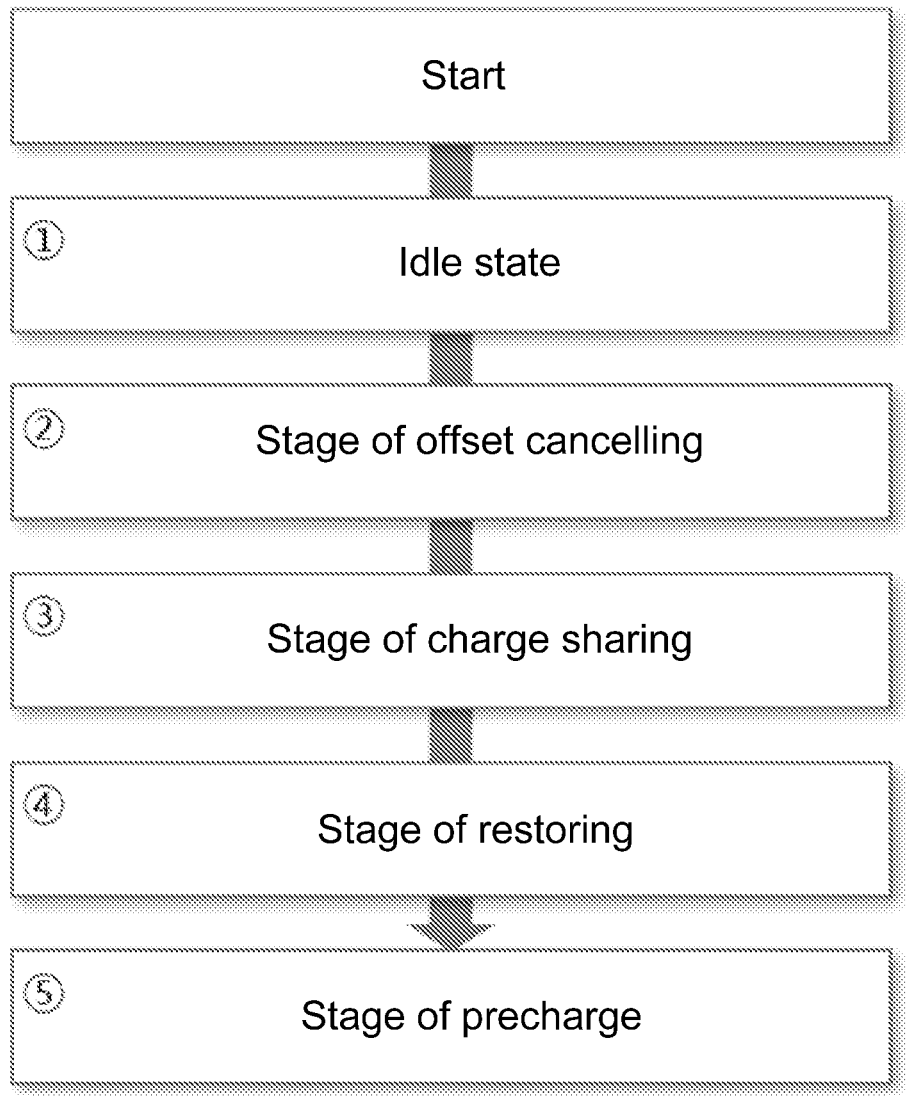
FIG. 2 is a flowchart of a control method of a sense amplifier in the prior art.

The sense amplifier may include operation stages, namely a stage of offset cancelling, a stage of charge sharing, a stage of restoring, and a stage of precharge. The flow chart of a control method of the control circuit corresponding to the sense amplifier is as shown in FIG. 2. When a read operation does not need to be performed, the sense amplifier is in an idle state. At this time, there is no data generated on the first to fourth transistors in the sense amplifier and the word lines in the memory cells. The matrix transistors N00 and N01 are both in a non-gated state.

Figure 3:
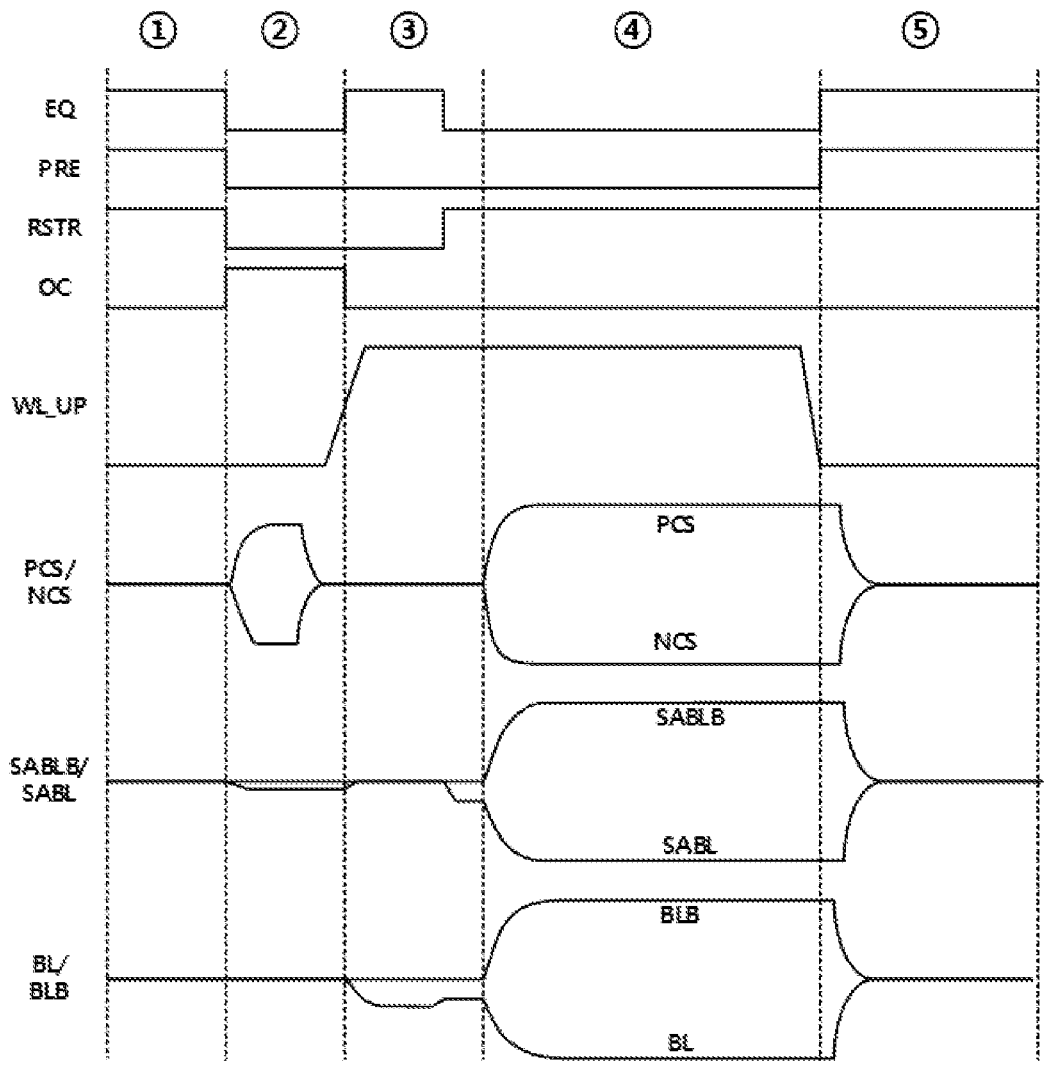
FIG. 3 is a timing diagram of a control method of a sense amplifier in the prior art.

FIG. 3 is a timing diagram of a control method of a sense amplifier. The process of the control method is described in detail with reference to FIG. 2 and FIG. 3. First, the sense amplifier enters the stage of offset cancelling in response to an offset canceling signal OC. For example, offset cancellation may be implemented through operations of a first offset canceling transistor N06 and a second offset canceling transistor N07. The first offset canceling transistor N06 and the second offset canceling transistor N07 are connected between the first connecting point A and the bit line BL as well as between the second connecting point B and the complementary bit line BLB. The first offset canceling transistor N06 and the second offset canceling transistor N07 are turned on or turned off in response to the offset canceling signal OC. When the offset canceling signal OC is valid at a high level, a gate of the first offset canceling transistor N06 is connected to a first electrode, and a gate of the second offset canceling transistor N07 is connected to the first electrode, to eliminate the offset of the sense amplifier caused by the situation where the performance of the transistors symmetrically configured in the sense amplifier is not completely the same, for example, threshold voltages are different, which in turn affects the accuracy of the data read from the memory.

After the stage of offset cancelling is over, the stage of charge sharing is entered. In the stage of charge sharing, the potential WL_UP of the word line is at a high level, and a first isolation transistor N10 and a second isolation transistor N11 are controlled to be turned on, thereby achieving charge sharing between the bit line BL and the corresponding memory cell as well as between the complementary bit line BLB and the corresponding memory cell.

Then, the bit line restore signal RSTR is controlled to be valid, and the stage of restoring is entered. For example, the stage of restoring may be entered through operations of a first restore transistor N02 and a second restore transistor N05. The first restore transistor N02 is connected between the second connecting point B and the gate of the third transistor N08, and the second restore transistor N05 is connected between the first connecting point A and the gate of the fourth transistor N09. When the bit line restore signal RSTR is valid at a high level, the first restore transistor N02 and the second restore transistor N05 are turned on, the potential WL_UP of the word line in each memory cell of the memory is at a high level, the positive power supply line PCS is at a high level, the negative power supply line NCS is at a low level, and the sense amplifier amplifies the signals on the bit line BL and the complementary bit line BLB and writes the read information (i.e., the amplified signal on the bit line BL) back into the memory cell.

After the stage of restoring, the stage of precharge is entered in response to a precharge signal PRE. For example, the precharge signal PRE may be received through the precharge transistor N04. The precharge transistor N04 is connected between a charge power supply VBLP and the second connecting point B, and starts the stage of precharge in response to the precharge signal.

In the above stages, the introduction of the stage of offset cancelling increases the minimum number of clock cycles TRCD required by the memory from accessing the memory cells at the row addresses to accessing the memory cells at the column addresses, thereby reducing the read efficiency of the memory.

Figure 4:
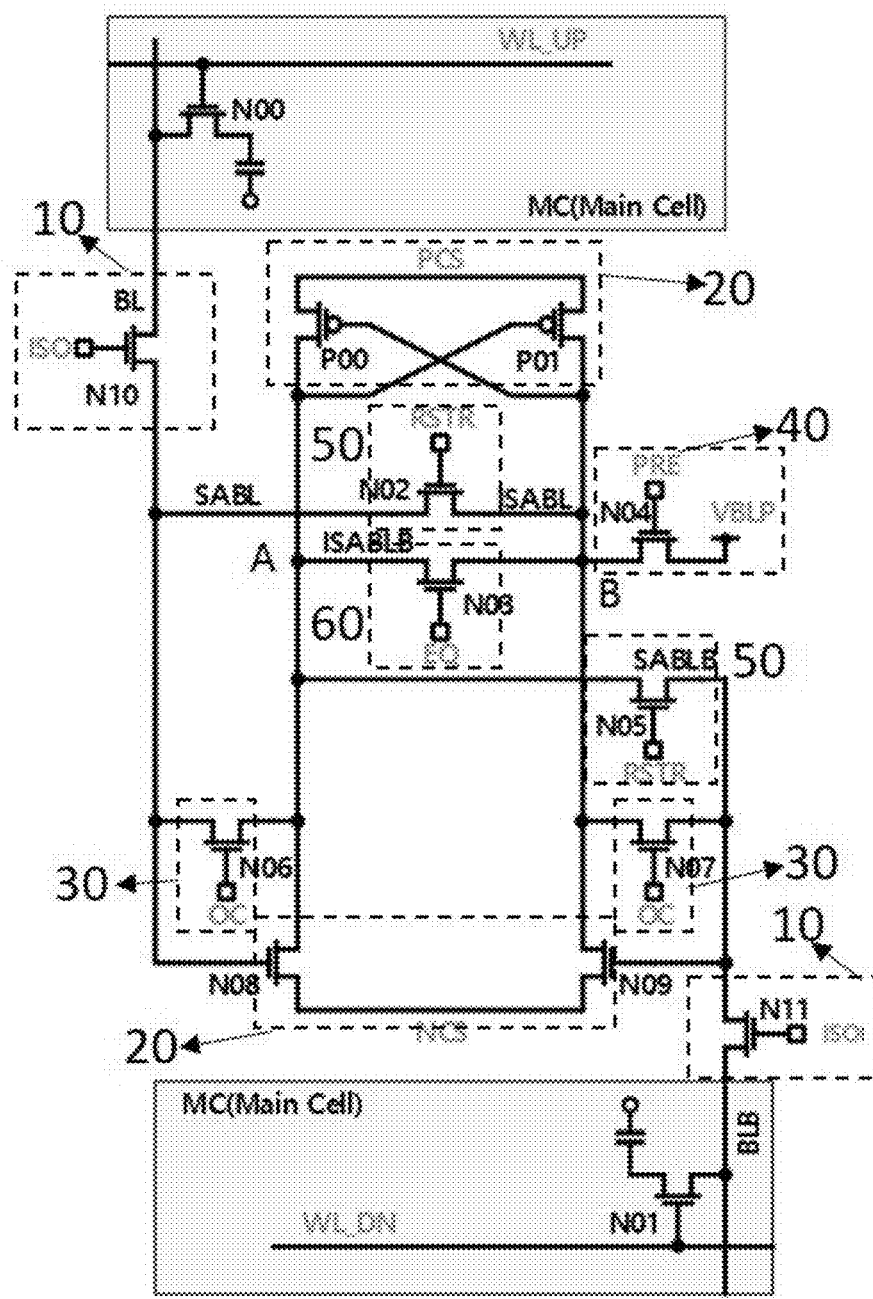
FIG. 4 is a schematic diagram of a circuit structure of a control device of a sense amplifier in a DRAM according to the present disclosure.

For the above problems, the embodiments of the present disclosure provide a readout circuit. As shown in FIG. 4, the readout circuit includes: a sense amplifier 20 and an isolation unit 10, the sense amplifier 20 being connected to a bit line BL and a complementary bit line BLB through the isolation unit, the bit line BL being connected to a memory cell MC and the complementary bit line BLB being connected to a memory cell MC, and the isolation unit 10 being configured to disconnect the sense amplifier 20 from the bit line BL and disconnect the sense amplifier 20 from the complementary bit line BLB in response to an isolation signal ISO. The readout circuit further includes an offset canceling unit 30 configured to perform offset cancellation on the sense amplifier 20 in response to an offset canceling signal OC, at least part of a stage of charge sharing between the bit line BL and the memory cell MC or the complementary bit line BLB and the memory cell MC being performed at the same time as at least part of a stage of offset cancelling.

In the present disclosure, by configuring the isolation unit 10 to control the connection between the sense amplifier 20 and the bit line BL and the connection between the sense amplifier 20 and the complementary bit line BLB, when the offset canceling unit 30 performs offset cancellation on the sense amplifier 20 in response to the offset canceling signal OC, at least part of the stage of charge sharing between the bit line BL and the memory cell MC or the complementary bit line BLB and the memory cell MC is performed simultaneously, thereby avoiding the influence of the offset cancellation on the charge sharing between the bit line BL and the memory cell MC or the complementary bit line BLB and the memory cell MC, also avoiding the situation where the TRCD of the cycles required by the memory from accessing the memory cells at the row addresses to accessing the memory cells at the column addresses is prolonged after the introduction of offset cancellation, reducing the TRCD delay, and increasing the access speed of the memory.

In some embodiments of the present disclosure, as shown in FIG. 4, the isolation unit 10 includes a first isolation transistor N10 and a second isolation transistor N11. The sense amplifier 20 is connected to the bit line BL through the first isolation transistor N10, and is connected to the complementary bit line BLB through the second isolation transistor N11.

In some embodiments of the present disclosure, the first isolation transistor N10 and the second isolation transistor N11 are N-type transistors.

In some embodiments of the present disclosure, as shown in FIG. 4, the sense amplifier 20 includes a first transistor P00, a second transistor P01, a third transistor N08, and a fourth transistor N09. A first electrode of the first transistor P00 and a first electrode of the second transistor P01 are connected to the first power supply line PCS, a second electrode of the third transistor N08 and a second electrode of the fourth transistor N09 are connected to the second power supply line NCS, a second electrode of the first transistor P00 and a first electrode of the third transistor N08 are mutually connected to the first connecting point A, and a second electrode of the second transistor P01 and a first electrode of the fourth transistor N09 are mutually connected to the second connecting point B.

In some embodiments of the present disclosure, the first transistor P00 and the second transistor P01 are P-type transistors, and the third transistor N08 and the fourth transistor N09 are N-type transistors.

In some embodiments of the present disclosure, as shown in FIG. 4, the gate of the first transistor P00 is connected to the first connecting point A, and the gate of the second transistor P01 is connected to the second connecting point B. The first isolation transistor N10 is connected between the gate of the third transistor N08 and the bit line BL, and the second isolation transistor N11 is connected between the gate of the fourth transistor N09 and the complementary bit line BLB. That is, the first isolation transistor N10 is provided with a first electrode connected to the bit line BL, a second electrode connected to the gate of the third transistor N08, and a gate for receiving an isolation signal. The second isolation transistor N11 is provided with a first electrode connected to the complementary bit line BLB, a second electrode connected to the gate of the fourth transistor N09, and a gate for receiving the isolation signal.

In some embodiments of the present disclosure, as shown in FIG. 4, the offset canceling unit 30 includes a first offset canceling transistor N06 and a second offset canceling transistor N07. The first offset canceling transistor N06 is connected between the first connecting point A and the gate of the third transistor N08, and the second offset canceling transistor N07 is connected between the second connecting point B and the gate of the fourth transistor N09. The first offset canceling transistor N06 and the second offset canceling transistor N07 perform offset cancellation on the third transistor N08 and the fourth transistor N09 in response to an offset canceling signal OC. That is, the first offset canceling transistor N06 is provided with a first electrode connected to the first connecting point A, a second electrode connected to the gate of the third transistor N08, and a gate for receiving the offset canceling signal OC. The second offset canceling transistor N07 is provided with a first electrode connected to the second connecting point B, a second electrode connected to the gate of the fourth transistor N09, and a gate for receiving the offset canceling signal OC.

In some embodiments of the present disclosure, as shown in FIG. 4, the readout circuit further includes an equalization transistor N08 connected between the first connecting point A and the second connecting point B and configured to operate in response to a bit line equalization signal EQ to equalize a potential of the first connecting point A and a potential of the second connecting point B. That is, the equalization transistor N08 is provided with a first electrode connected to the first connecting point A, a second electrode connected to the second connecting point B, and a gate for receiving the bit line equalization signal EQ.

In some embodiments of the present disclosure, as shown in FIG. 4, the readout circuit further includes a first restore transistor N02 and a second restore transistor N05. The first restore transistor N02 is connected between the second connecting point B and the gate of the third transistor N08, the second restore transistor N05 is connected between the first connecting point A and the gate of the fourth transistor N09, the first restore transistor N02 is configured to restore the bit line BL in response to the bit line restore signal RSTR, and the second restore transistor N05 is configured to restore the complementary bit line BLB in response to the bit line restore signal RSTR. That is, the first restore transistor N02 is provided with a first electrode connected to the second connecting point B, a second electrode connected to the gate of the third transistor N08, and a gate configured to receive the bit line restore signal RSTR. The second restore transistor N05 is provided with a first electrode connected to the first connecting point A, a second electrode connected to the gate of the fourth transistor N09, and a gate for receiving the bit line restore signal RSTR.

In some embodiments of the present disclosure, as shown in FIG. 4, the readout circuit further includes a precharge transistor N04. The precharge transistor N04 is connected between a precharge power supply VBLP and the second connecting point B, and is configured to precharge the second connecting point B in response to a precharge signal PRE. That is, the precharge transistor N04 is provided with a first electrode connected to the precharge power supply VBLP, a second electrode connected to the second connecting point B, and a gate for receiving the precharge signal PRE.

In the present disclosure, by providing the first isolation transistor N10 and the second isolation transistor N11, the first isolation transistor N10 and the second isolation transistor N11 are connected to the bit line BL and the complementary bit line BLB of two memory cells. The schematic structural diagram of the readout circuit is as shown in FIG. 4. The first electrode and the second electrode of the first isolation transistor N10 are respectively connected to the bit line BL of the memory cell and the gate of the third transistor N08, and the first electrode and the second electrode of the second isolation transistor N11 are respectively connected to the complementary bit line BLB of the memory cell and the gate of the fourth transistor N09. The gate of the first isolation transistor N10 and the gate of the second isolation transistor N11 are both controlled by the isolation signal ISO, and when the isolation signal ISO is at a low level, the bit line BL may be disconnected from the sense amplifier 20 and the complementary bit line BLB may be disconnected from the sense amplifier 20. That is, the sense amplifier 20 is isolated from the bit line BL and the complementary bit line BLB, such that part of the stage of charge sharing between the bit line BL and the memory cell MC or the complementary bit line BLB and the memory cell MC is performed at the same time as part of the stage of offset cancelling, and the offset cancellation cannot affect the potentials on the bit line BL and the complementary bit line BLB.

Figure 5:
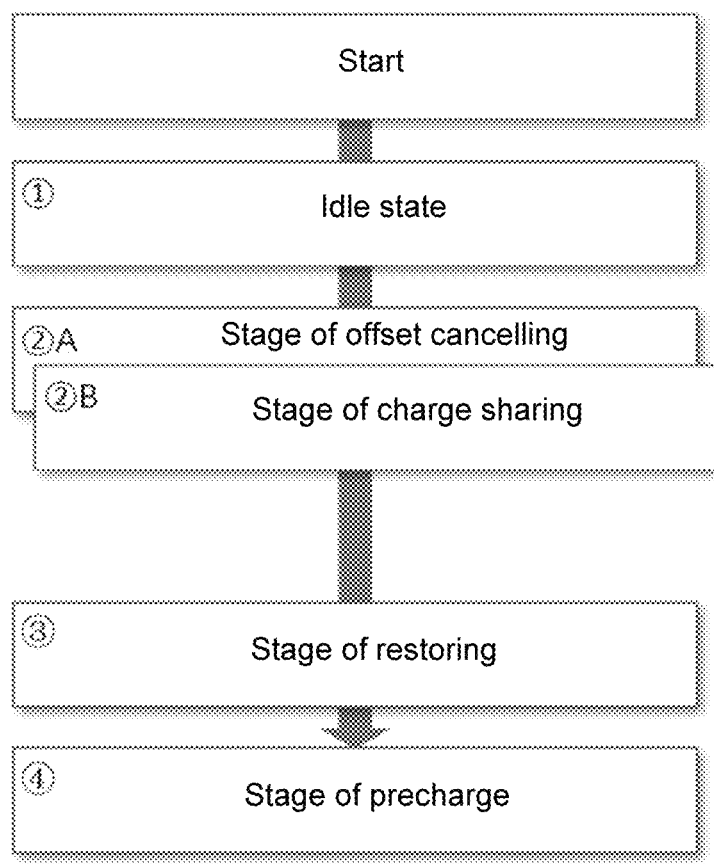
FIG. 5 is a flowchart of a control method of a sense amplifier in a DRAM according to the present disclosure.
Figure 6:
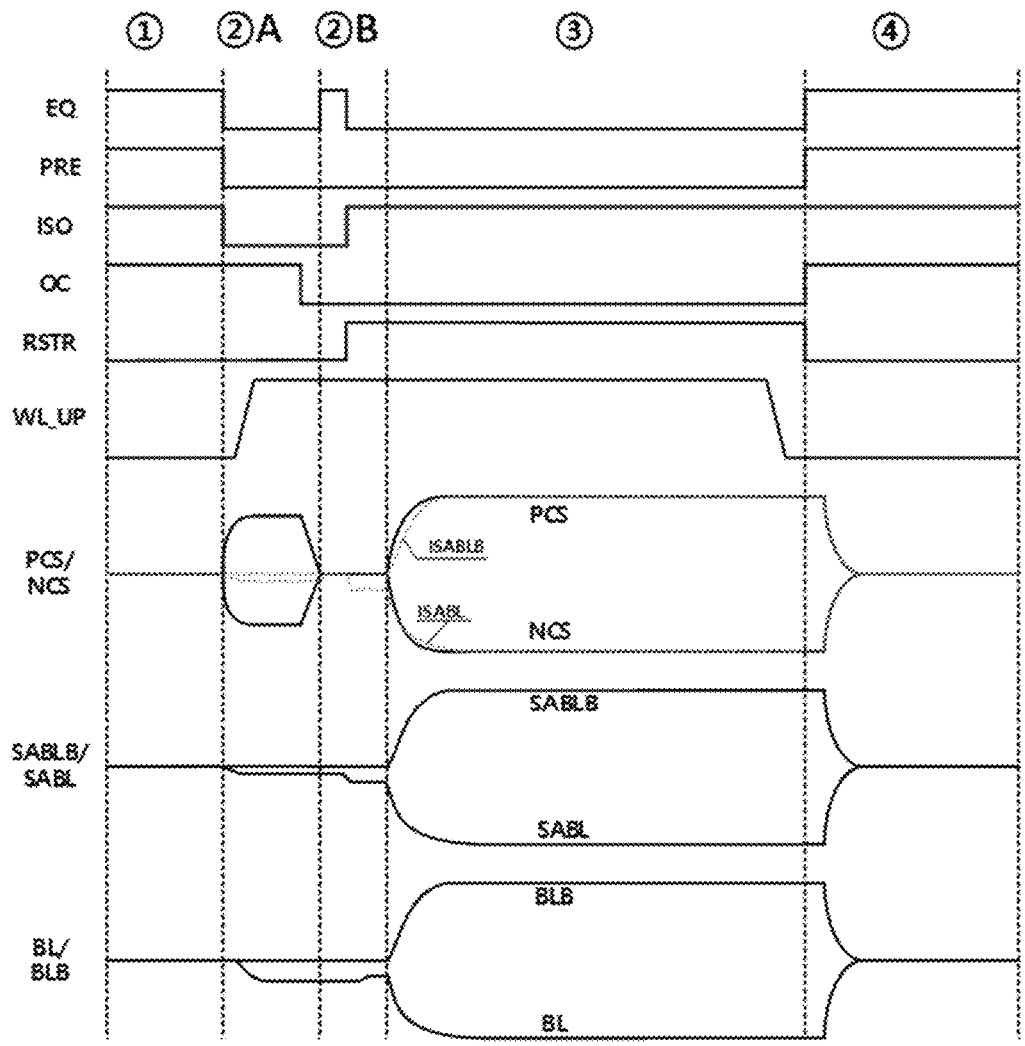
FIG. 6 is a timing diagram of a control method of a sense amplifier in a DRAM according to the present disclosure.

In some embodiments of the present disclosure, according to FIG. 4, FIG. 5, and FIG. 6, the driving mode of the readout circuit in the embodiments of the present disclosure may be divided into the following stages:

An idle stage (1) (i.e., a stage of precharge (4)): before the stage of offset cancelling, the stage of charge sharing, and the stage of restoring are started, the equalization signal EQ, the precharge signal PRE, the isolation signal ISO, and the offset canceling signal OC are all at a high level, the first power supply line PCS and the second power supply line NCS provide the same intermediate potential (which is the same as a signal provided by the precharge power supply VBLP), and the remaining signals are at a low level, thereby precharging the readout circuit.

A stage of offset cancelling (2)A: at this time, the offset canceling signal OC is at a high level, the first power supply line PCS provides a high level, the second power supply line NCS provides a low level, the signal WL_UP of the word line of the memory cell connected to the bit line BL is at a high level at least part of the time, the remaining signals are at a low level, and at this time, the first offset canceling transistor N06 and the second offset canceling transistor N07 are turned on, to eliminate the offset of the sense amplifier 20 caused by the situation where the performance of the third transistor N08 and the fourth transistor N09 symmetrically configured in the sense amplifier 20 is not completely the same, for example, the threshold voltages are different, which in turn affects the accuracy of the data read from the memory. Moreover, at this time, the memory cell and the bit line BL are turned on at least part of the time, such that charges stored in the memory cell MC begin to be shared with the bit line BL. That is, the information of the memory cell MC begins to be transferred onto the bit line BL.

A stage of charge sharing (2)B: after the stage of offset cancelling (2)A is finished, that is, the equalization signal EQ is at a high level, the first power supply line PCS and the second power supply line NCS provide the same intermediate potential, the isolation signal ISO and the restore signal RSTR are changed to be at a high level after the equalization signal EQ is changed to be at a low level, the signal WL_UP of the word line of the memory cell connected to the bit line BL is at a high level, the remaining signals are at a low level, and at this time, the equalization transistor N08 is turned on to equalize the potential between the first connecting point A and the second connecting point B after the offset cancellation. After the equalization transistor N08 is turned off, the first isolation transistor N10, the second isolation transistor N11, the first restore transistor, N02 and the second restore transistor N05 are turned on, such that the potentials on the bit line BL and the complementary bit line BLB are transmitted to the sense amplifier 20.

A stage of restoring (3) (i.e., a stage of amplification): the isolation signal ISO, the restore signal RSTR, and the signal WL_UP of the word line of the memory cell connected to the bit line BL are kept at a high level, the first power supply line PCS provides a high level, the second power supply line NCS provides a low level, the remaining signals are all at a low level, at this time, the first isolation transistor N10, the second isolation transistor N11, the first restore transistor N02, and the second restore transistor N05 are turned on, and at this time, the sense amplifier is operated under the driving of the first power supply line PCS and the second power supply line NCS to amplify the potentials of the first connecting point A and the second connecting point B. Taking data "1" stored in the memory cell connected to the bit line BL as an example, the potential of the first connecting point A is reduced continuously, the potential of the second connecting point B is gradually increased, and the amplified potentials are respectively restored to the bit line BL and the complementary bit line BLB, and then restored to the memory cell MC of the bit line BL.

Another aspect of the present disclosure further provides a memory. The memory includes the readout circuit provided in the above embodiments. The memory may be a volatile memory, for example, a dynamic random access memory (DRAM), a synchronous dynamic random access memory (SDRAM), a double data rate synchronous dynamic random access memory (DDR SDRAM), a low-power double data rate synchronous dynamic random access memory (LPDDR SDRAM), a graphics double data rate synchronous dynamic random access memory (GDDR SDRAM), a double data rate type 2 synchronous dynamic random access memory (DDR2 SDRAM), a double data rate 3 synchronous dynamic random access memory (DDR3 SDRAM), a double data rate 4 synchronous dynamic random access memory (DDR4 SDRAM), or a thyristor random access memory (TRAM); or may be a non-volatile memory, for example, a phase-change random access memory (PRAM), a magnetoresistive random access memory (MRAM), or a resistive random access memory (RRAM).

Figure 7:
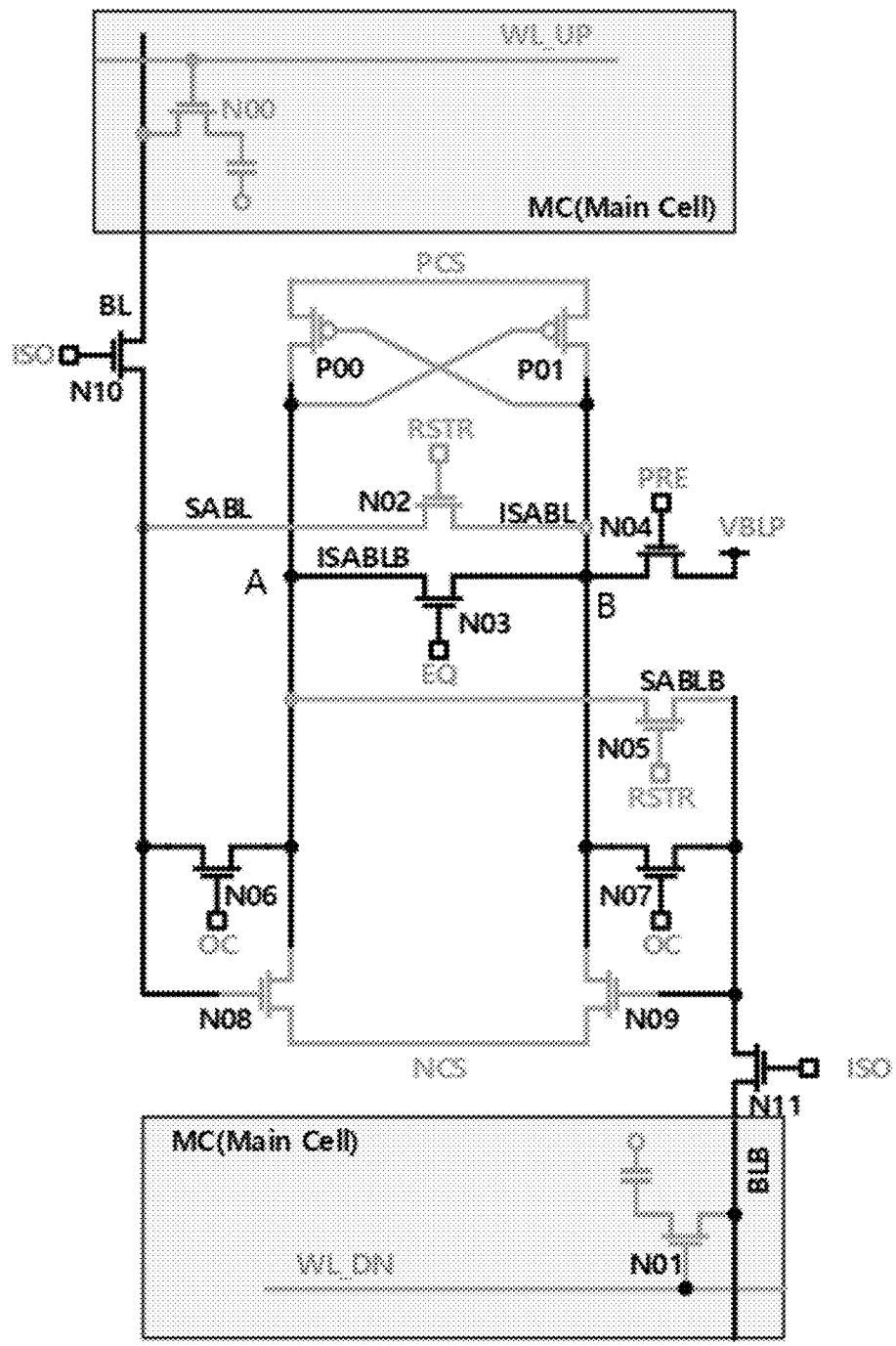
FIG. 7 is a schematic diagram of a circuit state in an idle state according to one embodiment of the present disclosure.
Figure 8:
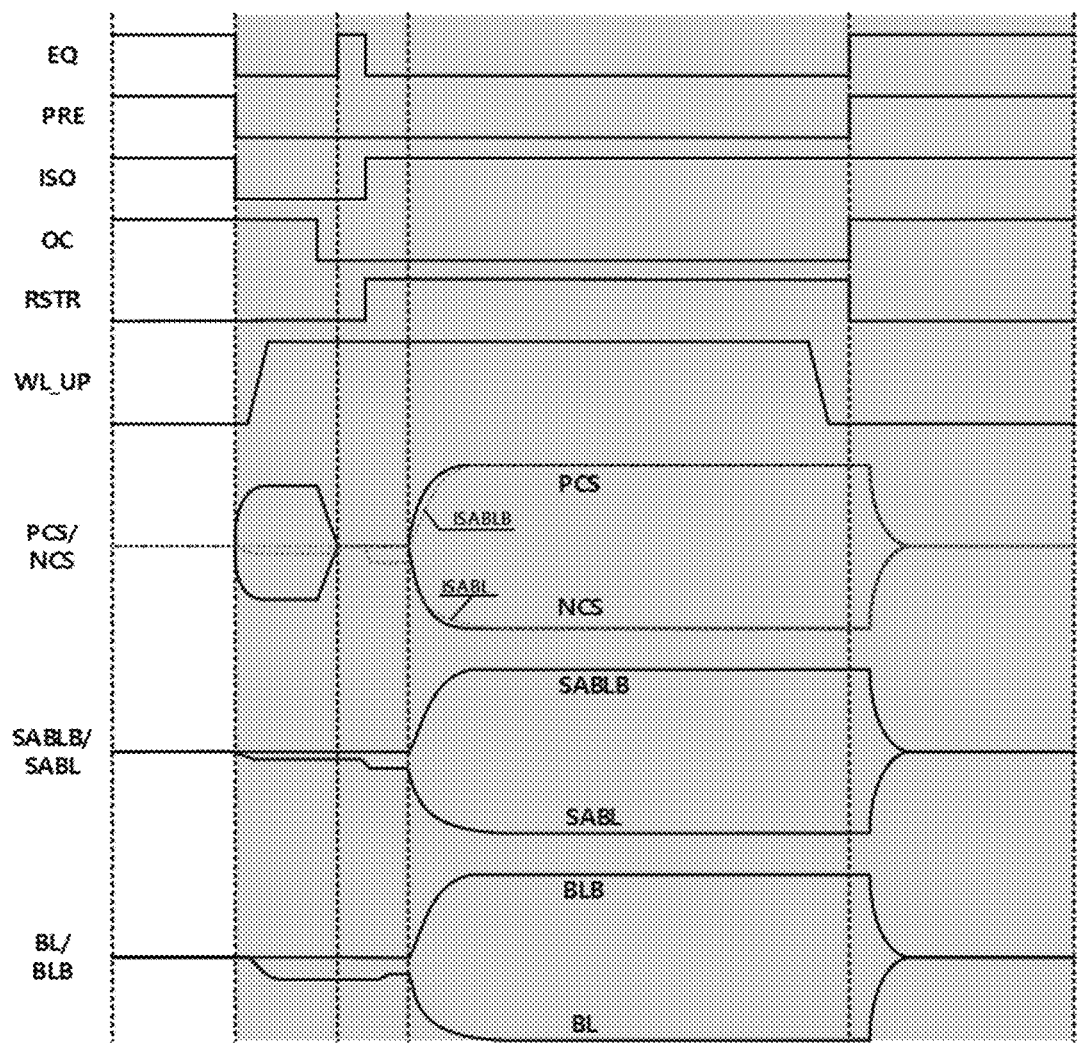
FIG. 8 is a timing diagram of a control signal in an idle state according to one embodiment of the present disclosure.

Another aspect of the present disclosure further provides a method of reading out data of a memory. The memory includes the readout circuit provided in the above embodiments, to increase the read-write speed of the memory. The flow diagram of the control method is as shown in FIG. 5. FIG. 6 is a timing diagram of control signals corresponding to steps in FIG. 5. The control method includes:

The isolation unit 10 is controlled, such that the sense amplifier 20 is connected to the bit line BL and the complementary bit line BLB to precharge the readout circuit. That is, before the isolation signal is controlled to be valid, the sense amplifier is in the idle stage. FIG. 7 is a schematic diagram of a circuit state of an on-off condition of each switching tube in an idle stage, and corresponds to the timing diagram of control signals shown in FIG. 8. The situation in the idle stage is the same as that in the prior art above, and details are not repeated herein.

Figure 10:
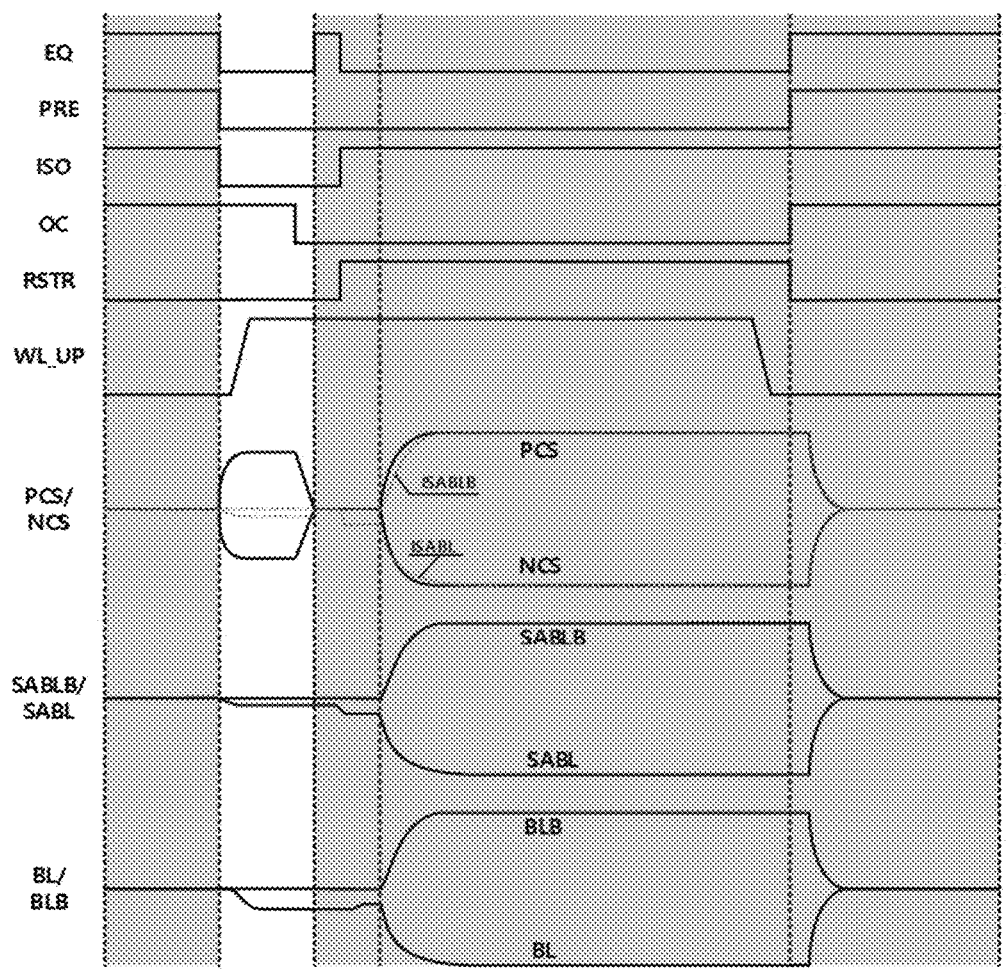
FIG. 10 is a timing diagram of a control signal in a stage of offset cancelling when an isolation signal is valid according to one embodiment of the present disclosure.
Figure 11:
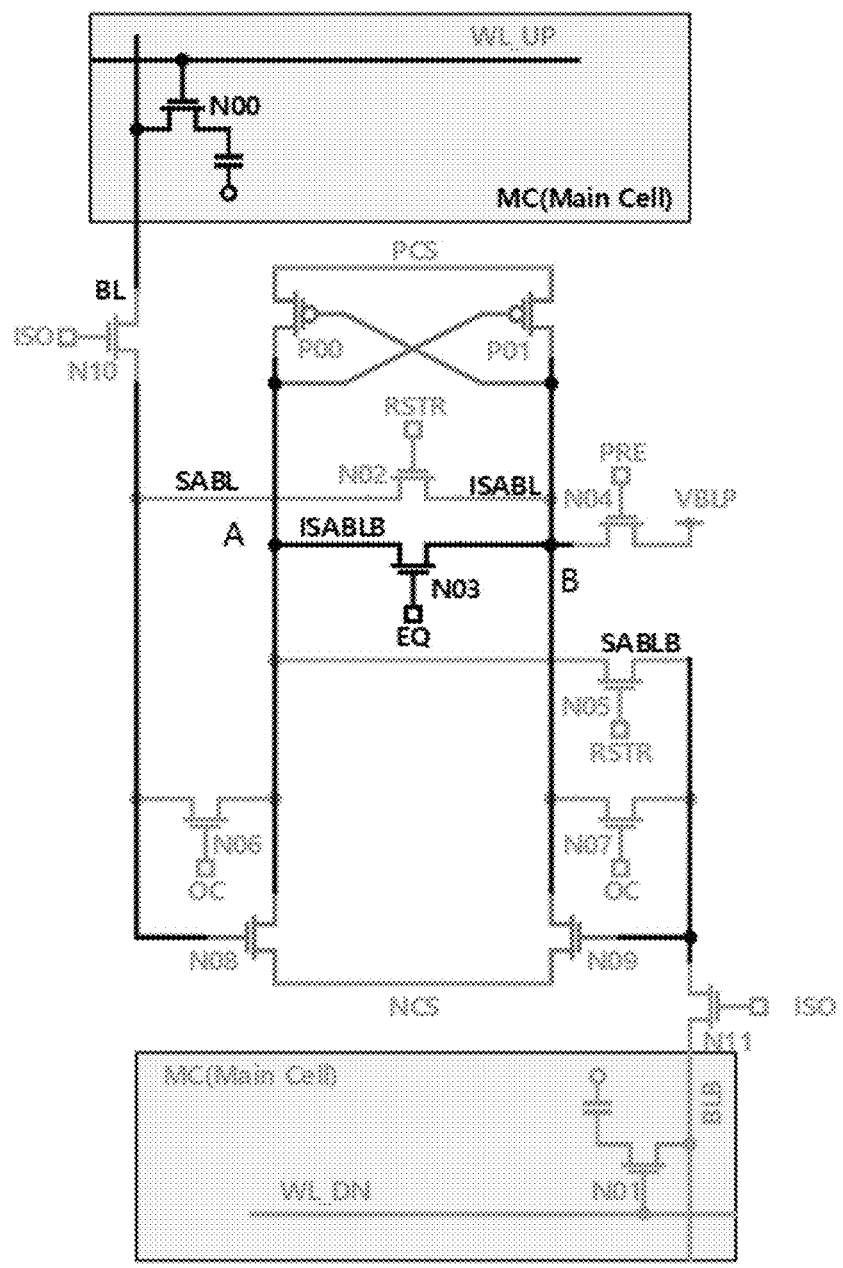
FIG. 11 is a schematic diagram of a circuit state in a stage of charge sharing when an isolation signal is valid according to one embodiment of the present disclosure.
Figure 12:
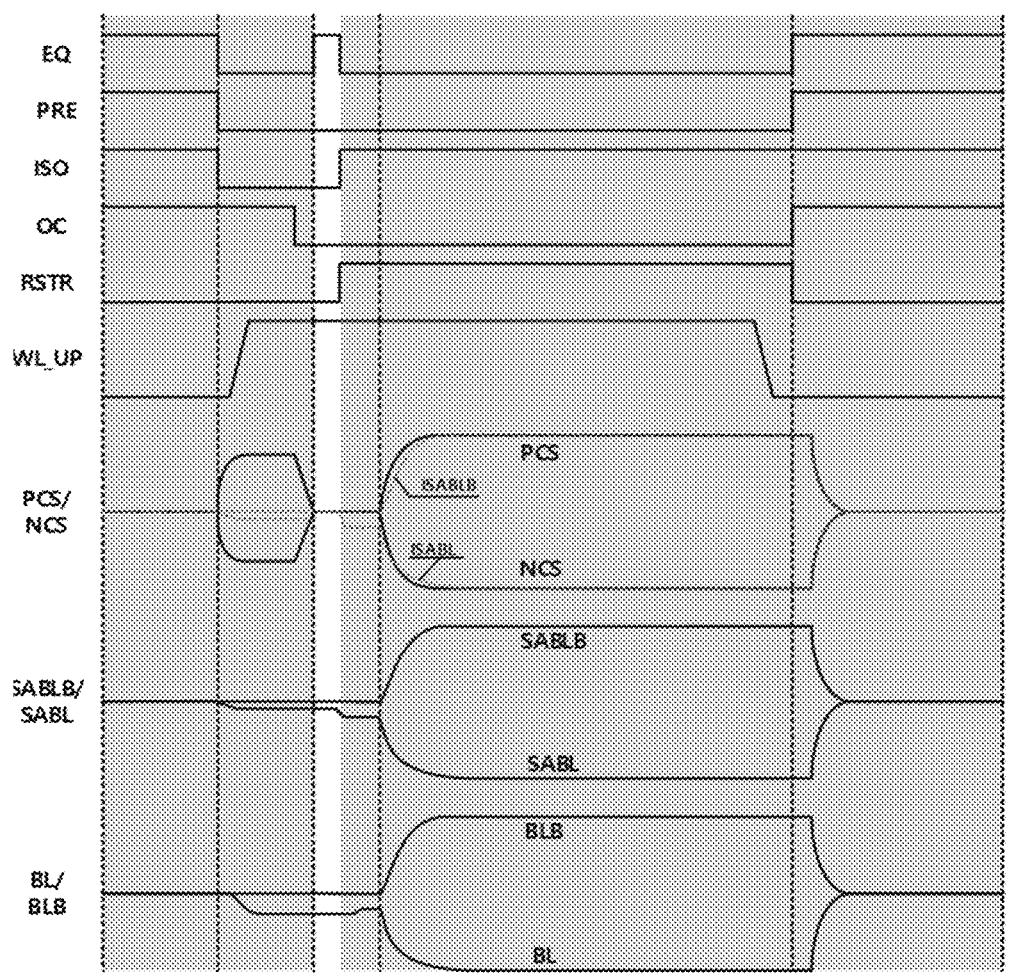
FIG. 12 is a timing diagram of a control signal in a stage of charge sharing when an isolation signal is valid according to one embodiment of the present disclosure.

The isolation unit 10 is controlled to disconnect the sense amplifier 20 from the bit line BL and disconnect the sense amplifier 20 from the complementary bit line BLB. That is, the isolation signal ISO is controlled to be at a low level, and the sense amplifier 20 is isolated from the bit line and the complementary bit line connected thereto. At this time, the equalization signal EQ, the precharge signal PRE, and the restore signal RSTR are all at a low level. The isolation signal ISO is at a low level, such that both the first isolation transistor N10 and the second isolation transistor N11 are turned off, that is, the memory cells of the memory are disconnected from the sense amplifier. FIG. 11 is a schematic diagram of a circuit state of an on-off condition of each switching tube in a stage where the isolation signal ISO is at a low level, and corresponds to the timing diagram of control signals shown in FIG. 10 and FIG. 12.

Figure 9:
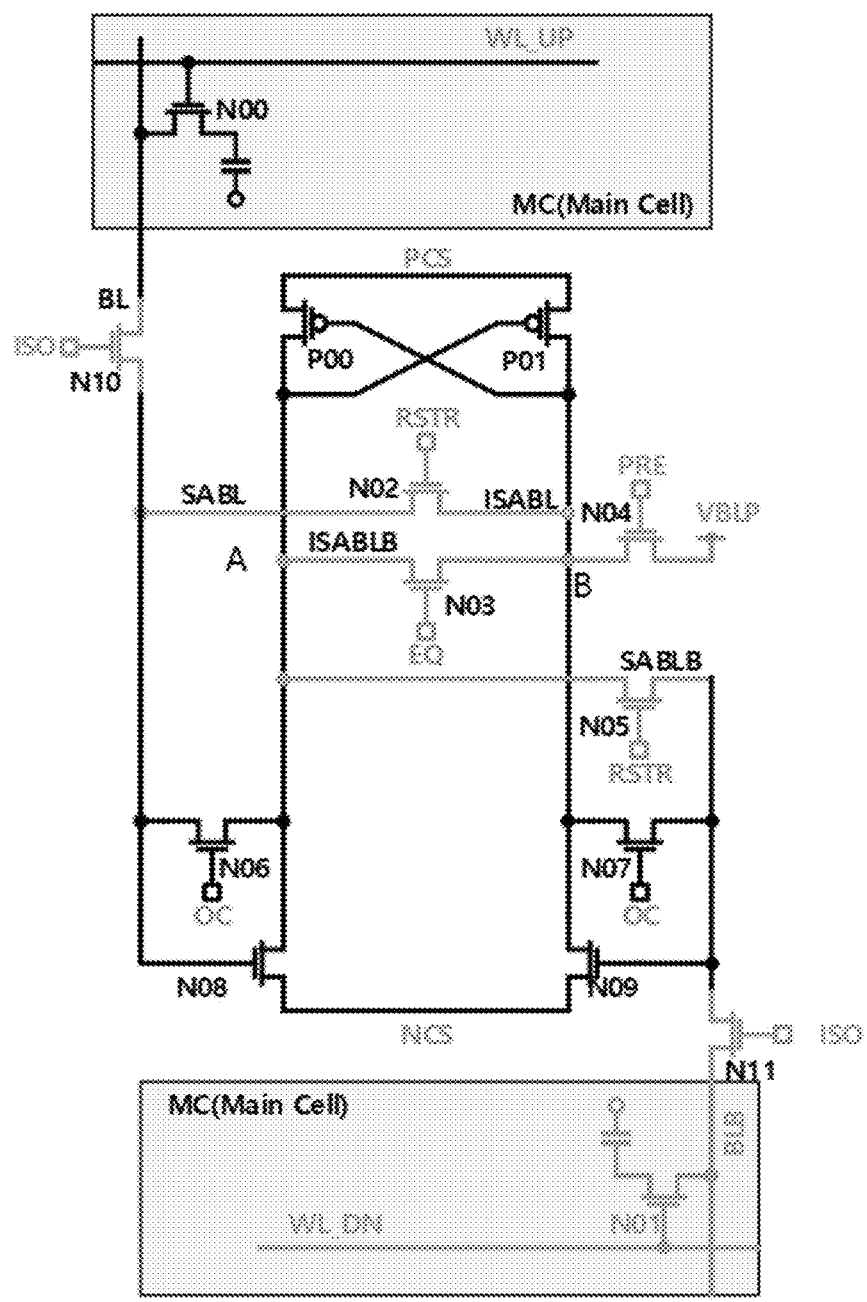
FIG. 9 is a schematic diagram of a circuit state in a stage of offset cancelling when an isolation signal is valid according to one embodiment of the present disclosure.

In the period of disconnecting the sense amplifier 20 from the bit line BL and the complementary bit line BLB, the offset canceling signal OC is controlled to be valid, such that at least part of the stage of charge sharing between the bit line BL and the memory cell MC or the complementary bit line BLB and the memory cell MC is performed at the same time as at least part of the stage of offset cancelling. That is, in the period when the isolation signal ISO is at a low level, the offset canceling signal OC and the bit line equalization signal EQ are respectively controlled to be valid, such that at least part of the stage of offset cancelling is performed at the same time as at least part of the stage of charge sharing. As shown in FIG. 9, in the stage of offset cancelling (2)A, at this time, the offset canceling signal OC is at a high level, the first power supply line PCS provides a high level, the second power supply line NCS provides a low level, the signal WL_UP of the word line of the memory cell connected to the bit line BL is at a high level at least part of the time, the remaining signals are at a low level, and at this time, the first offset canceling transistor N06 and the second offset canceling transistor N07 are turned on, to eliminate the offset of the sense amplifier 20 caused by the situation where the performance of the third transistor N08 and the fourth transistor N09 symmetrically configured in the sense amplifier 20 is not completely the same, for example, the threshold voltages are different, which in turn affects the accuracy of the data read from the memory. Moreover, in the stage of offset cancelling, at this time, the memory cell and the bit line BL are turned on at least part of the time, such that charges stored in the memory cell MC begin to be shared with the bit line BL. That is, the information of the memory cell MC begins to be transferred onto the bit line BL.

A stage of charge sharing (2)B: after the stage of offset cancelling (2)A is finished, that is, the equalization signal EQ is at a high level, the first power supply line PCS and the second power supply line NCS provide the same intermediate potential, the isolation signal ISO and the restore signal RSTR are changed to be at a high level after the equalization signal EQ is changed to be at a low level, the signal WL_UP of the word line of the memory cell connected to the bit line BL is at a high level, the remaining signals are at a low level, and at this time, the equalization transistor N08 is turned on to equalize the potential between the first connecting point A and the second connecting point B after the offset cancellation. After the equalization transistor N08 is turned off, the first isolation transistor N10, the second isolation transistor N11, the first restore transistor, N02 and the second restore transistor N05 are turned on, such that the potentials on the bit line BL and the complementary bit line BLB are transmitted to the sense amplifier 20.

After the stage of offset cancelling is finished, and before the stage of charge sharing is finished, the equalization signal EQ is kept at a high level for part of the time to equalize the potential between the first connecting point A and the second connecting point B.

Figure 13:
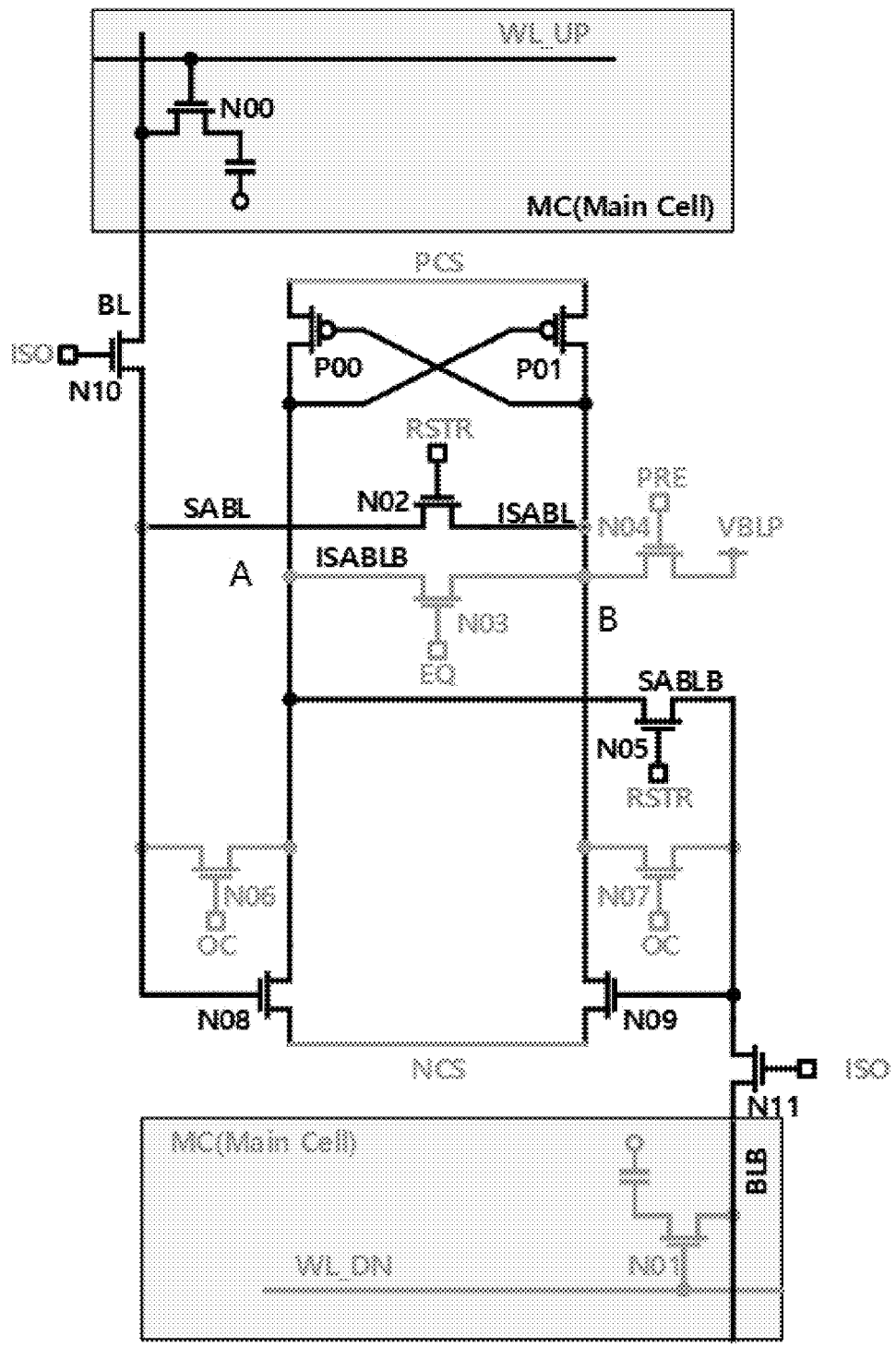
FIG. 13 is a schematic diagram of a circuit state at the end of a stage of offset cancelling and a stage of charge sharing according to one embodiment of the present disclosure.
Figure 14:
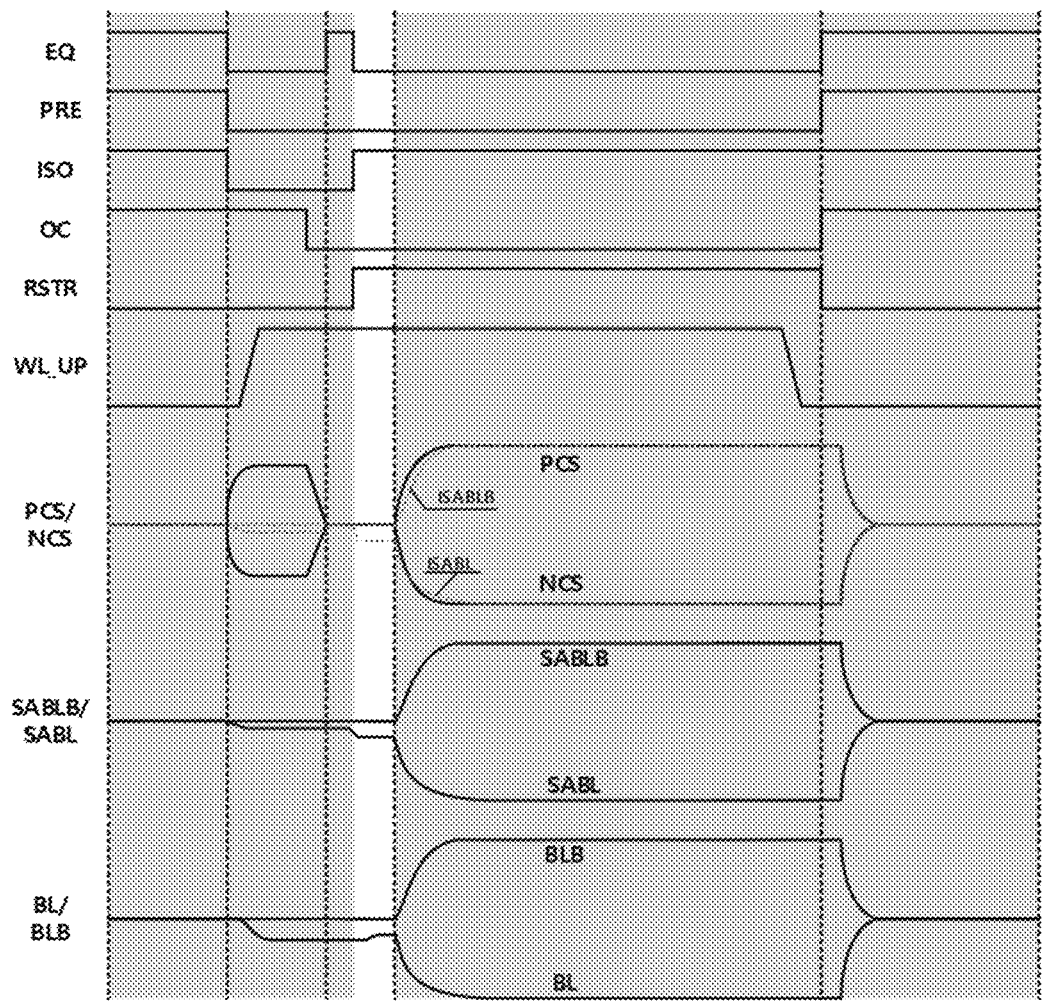
FIG. 14 is a timing diagram of a control signal at the end of a stage of offset cancelling and a stage of charge sharing according to one embodiment of the present disclosure.

When both the stage of offset cancelling and the stage of charge sharing are finished, the isolation signal ISO is changed to be in a high-level state, the restore signal RSTR is at a high level, and the remaining signals are at a low level, to restore the connection between the memory cell of the DRAM and the sense amplifier for the preparation of entering the stage of data restoring. As shown in FIG. 13 and FIG. 14, FIG. 13 and FIG. 14 are respectively a schematic diagram of circuit states and a timing diagram of control signals in the stage of offset cancelling and the stage of charge sharing.

Figure 15:
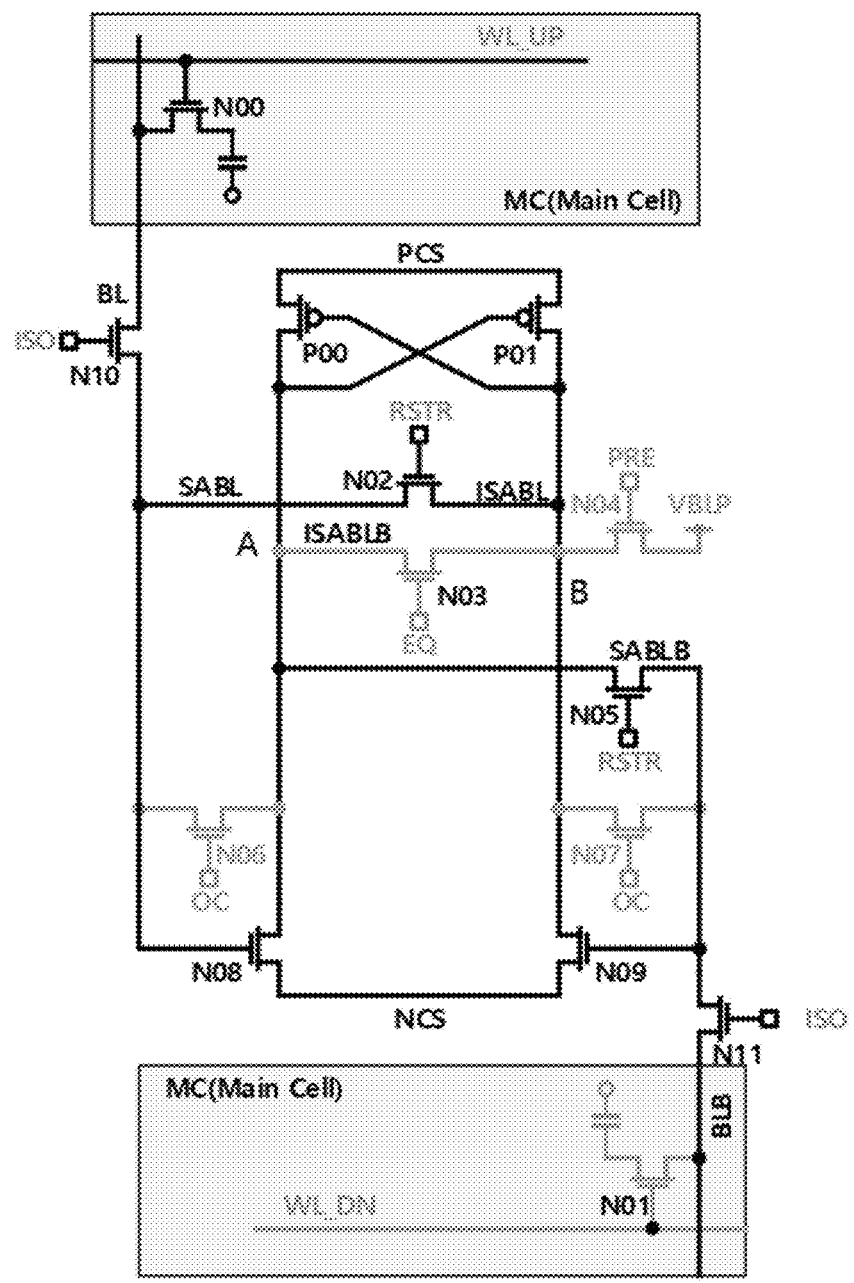
FIG. 15 is a schematic diagram of a circuit state in a stage of restoring according to one embodiment of the present disclosure.
Figure 16:
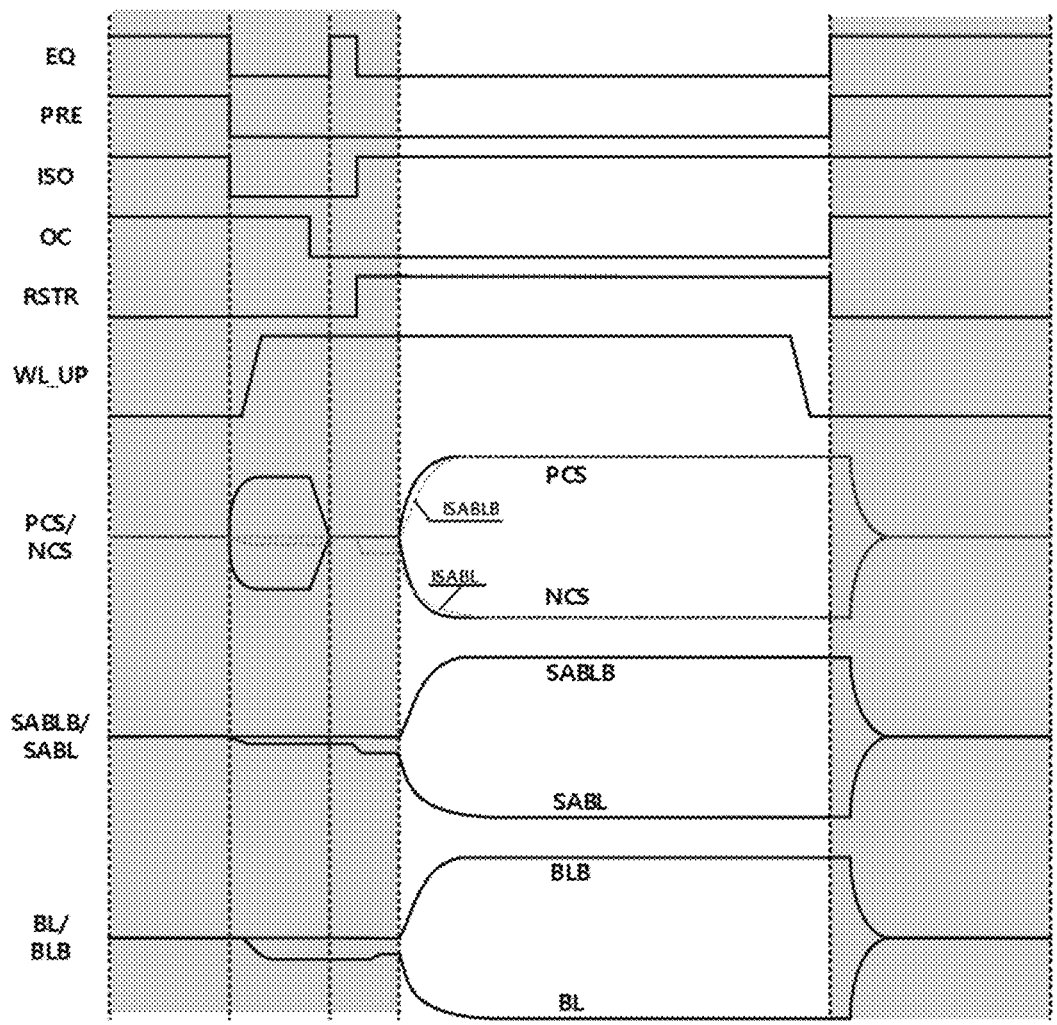
FIG. 16 is a timing diagram of a control signal in a stage of restoring according to one embodiment of the present disclosure.

When the restore signal of the bit line is controlled to be valid, the bit line and the complementary bit line are respectively restored. That is, after the stage of offset cancelling and the stage of charge sharing are finished, the sense amplifier is restored. FIG. 15 and FIG. 16 are respectively a schematic diagram of circuit states and a timing diagram of control signals in the stage of restoring. As shown in FIG. 15, in the stage of restoring (3) (i.e., a stage of amplification), the isolation signal ISO, the restore signal RSTR, and the signal WL_UP of the word line of the memory cell connected to the bit line BL are kept at a high level, the first power supply line PCS provides a high level (for example, it may be VDD), the second power supply line NCS provides a low level, the remaining signals are all at a low level, at this time, the first isolation transistor N10, the second isolation transistor N11, the first restore transistor N02, and the second restore transistor N05 are turned on, and at this time, the sense amplifier is operated under the driving of the first power supply line PCS and the second power supply line NCS to amplify the potentials of the first connecting point A and the second connecting point B. Taking data "1" stored in the memory cell connected to the bit line BL as an example, the potential of the first connecting point A is reduced continuously, the potential of the second connecting point B is gradually increased, and the amplified potentials are respectively restored to the bit line BL and the complementary bit line BLB, and then restored to the memory cell MC of the bit line BL.

Figure 17:
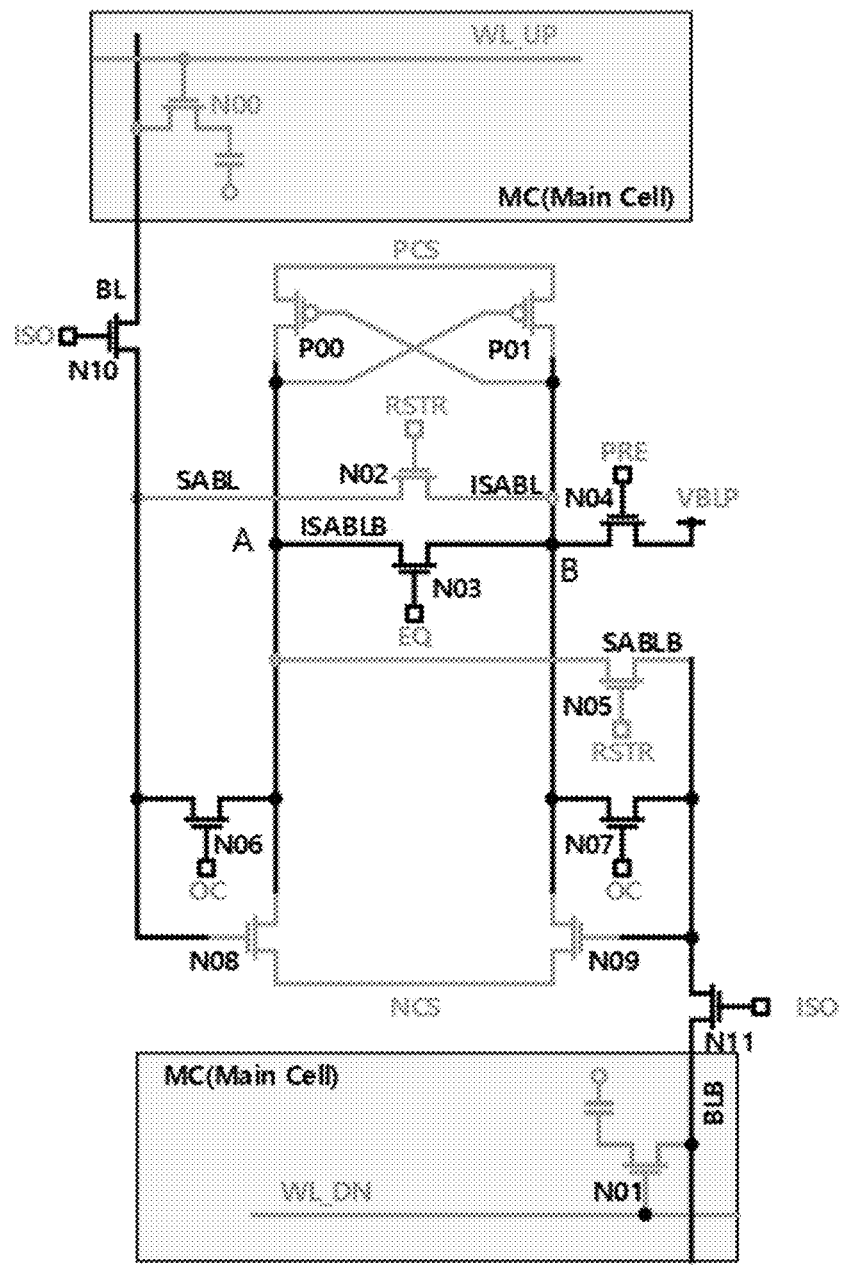
FIG. 17 is a schematic diagram of a circuit state in a stage of precharge according to one embodiment of the present disclosure.
Figure 18:
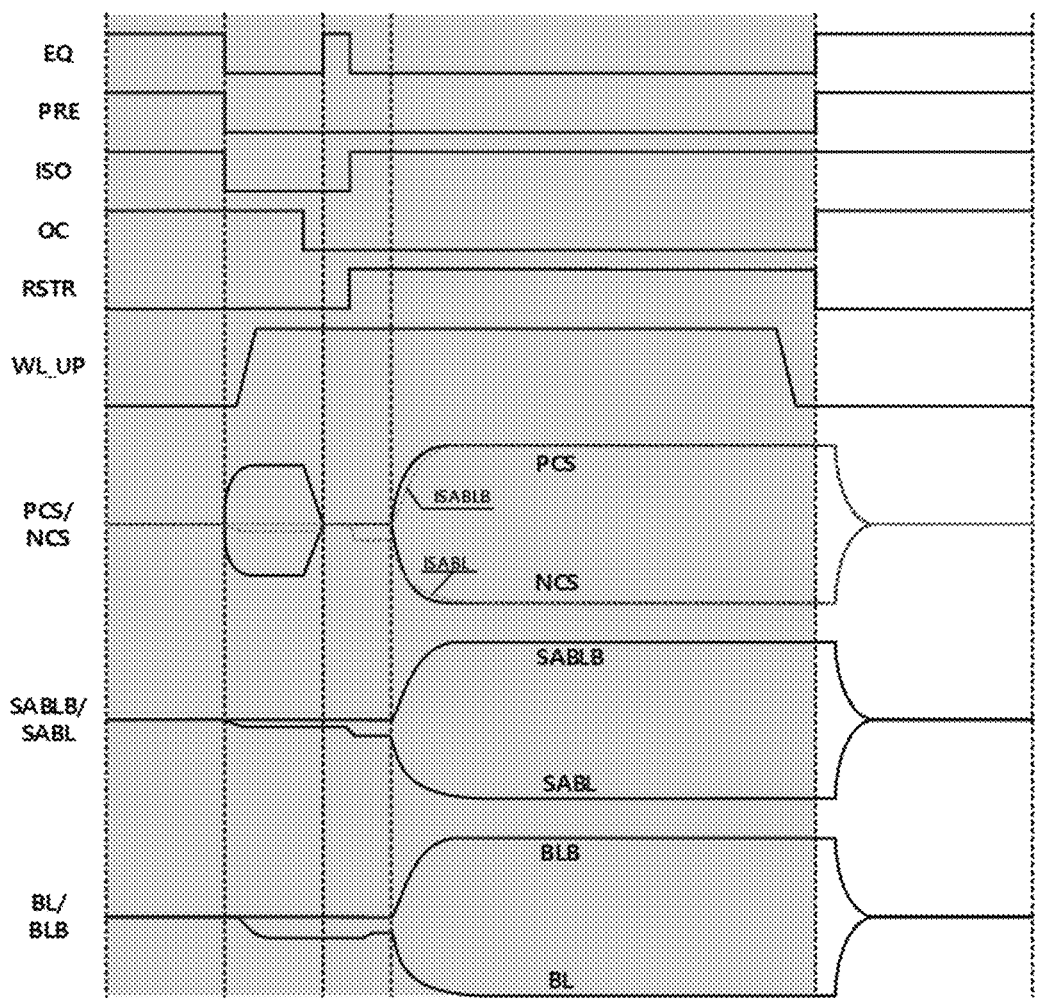
FIG. 18 is a timing diagram of a control signal in a stage of precharge according to one embodiment of the present disclosure.

The precharge signal is controlled to be valid, to make the sense amplifier enter the stage of precharge. FIG. 17 and FIG. 18 are respectively a schematic diagram of circuit states and a timing diagram of control signals in the stage of precharge. In the stage of precharge, when the precharge signal PRE is valid at a high level, the precharge transistor N04 is turned on. When the bit line equalization signal EQ is valid at a high level, the equalization transistor N03 is turned on. The sense amplifier is connected to the charge power supply VBLP for precharge. Moreover, the first transistor to the fourth transistor of the sense amplifier are controlled to turn off, the potentials on the positive power supply line PCS and the negative power supply line NCS are gradually changed to a precharge potential (for example, the precharge potential may be VDD/2), the first transistor P00 and the second transistor P01 are turned off in response to a PCS signal, and the third transistor N08 and the fourth transistor N09 are turned off in response to a NCS signal. The matrix transistors N00 and N01 connected to the word line and the bit line are turned off; and each bit line, the first connecting point A, and the second connecting point B are precharged to the intermediate potential.

In conclusion, the present disclosure provides a readout circuit, a memory, and a method of reading out data of a memory. The readout circuit includes: a sense amplifier and an isolation unit, the sense amplifier being connected to a bit line and a complementary bit line through the isolation unit, the bit line being connected to a memory cell and the complementary bit line being connected to a memory cell, and the isolation unit being configured to disconnect the sense amplifier from the bit line and the complementary bit line in response to an isolation signal; and an offset canceling unit configured to perform offset cancellation on the sense amplifier in response to an offset canceling signal, at least part of a stage of charge sharing between the bit line and the memory cell or the complementary bit line and the memory cell being performed at the same time as at least part of a stage of operation of the offset canceling unit, thereby reducing the situation where the TRCD of the cycles required by the memory from accessing the memory cells at the row addresses to accessing the memory cells at the column addresses is prolonged after the introduction of offset cancellation, reducing the TRCD delay, and increasing the access speed of the memory.

The embodiments or implementations of this specification are described in a progressive manner, and each embodiment focuses on differences from other embodiments. The same or similar parts between the embodiments may refer to each other.

In the description of this specification, the description with reference to terms such as "an embodiment", "an exemplary embodiment", "some implementations", "a schematic implementation", and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one structure from another.

The same elements in one or more accompanying drawings are denoted by similar reference numerals. For the sake of clarity, various parts in the accompanying drawings are not drawn to scale. In addition, some well-known parts may not be shown. For the sake of brevity, a structure obtained by implementing a plurality of steps may be shown in one figure. In order to understand the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

According to the readout circuit, the memory, and the method of reading out data of a memory provided in the embodiments of the present disclosure, by providing the isolation transistors in the control circuit of the sense amplifier, in the period that the isolation signal is valid, the isolation transistors are disconnected to isolate the sense amplifier and the memory cells of two DRAMs connected thereto from each other, such that the charge sharing and the offset cancellation can be performed at the same time, thereby reducing the TRCD of the cycles required by the DRAM from accessing the memory cells at the row addresses to accessing the memory cells at the column addresses, and greatly increasing the access speed of the DRAM.

The invention claimed is:

1. A readout circuit, comprising:
a sense amplifier and an isolation unit, the sense amplifier being connected to a bit line and a complementary bit line through the isolation unit, the bit line being connected to a memory cell and the complementary bit line being connected to a second memory cell, and
the isolation unit being configured to completely disconnect the sense amplifier from the bit line and the complementary bit line in response to an isolation signal; and
an offset canceling unit, configured to perform an offset cancellation on the sense amplifier in response to an offset canceling signal, at least a part of a stage of a charge sharing between the bit line and the memory cell or the complementary bit line and the second memory cell being performed at a same time as at least a part of a stage of an operation of the offset canceling unit.

2. The readout circuit according to claim 1, wherein the isolation unit comprises a first isolation transistor and a second isolation transistor; and
the sense amplifier is connected to the bit line through the first isolation transistor and connected to the complementary bit line through the second isolation transistor.

3. The readout circuit according to claim 2, wherein the first isolation transistor and the second isolation transistor are N-type transistors.

4. The readout circuit according to claim 2, wherein the sense amplifier comprises a first transistor, a second transistor, a third transistor, and a fourth transistor;
a first electrode of the first transistor and a first electrode of the second transistor are connected to a first power supply line, and a second electrode of the third transistor and a second electrode of the fourth transistor are connected to a second power supply line; and
a second electrode of the first transistor and a first electrode of the third transistor are mutually connected to a first connecting point, and a second electrode of the second transistor and a first electrode of the fourth transistor are mutually connected to a second connecting point.

5. The readout circuit according to claim 4, wherein the first transistor and the second transistor are P-type transistors, and the third transistor and the fourth transistor are N-type transistors.

6. The readout circuit according to claim 4, wherein a gate of the first transistor is connected to the first connecting point, and a gate of the second transistor is connected to the second connecting point; and
the first isolation transistor is connected between a gate of the third transistor and the bit line, and the second isolation transistor is connected between a gate of the fourth transistor and the complementary bit line.

7. The readout circuit according to claim 6, wherein the offset canceling unit comprises a first offset canceling transistor and a second offset canceling transistor, the first offset canceling transistor is connected between the first connecting point and the gate of the third transistor, and the second offset canceling transistor is connected between the second connecting point and the gate of the fourth transistor; and
the first offset canceling transistor and the second offset canceling transistor perform the offset cancellation on the third transistor and the fourth transistor in response to the offset canceling signal.

8. The readout circuit according to claim 7, further comprising: an equalization transistor, connected between the first connecting point and the second connecting point and configured to operate in response to a bit line equalization signal to equalize a potential of the first connecting point and a potential of the second connecting point.

9. The readout circuit according to claim 8, further comprising: a first restore transistor and a second restore transistor, wherein the first restore transistor is connected between the second connecting point and the gate of the third transistor, the second restore transistor is connected between the first connecting point and the gate of the fourth transistor, the first restore transistor performs a restoring operation on the bit line in response to a bit line restore signal, and the second restore transistor performs a restoring operation on the complementary bit line in response to the bit line restore signal.

10. The readout circuit according to claim 9, further comprising: a precharge transistor, connected between a precharge power supply and the second connecting point and configured to precharge the second connecting point in response to a precharge signal.

11. A memory, comprising the readout circuit according to claim 1.

12. A method of reading out data of a memory, wherein the memory comprises the readout circuit according to claim 1; and the method of reading out data comprises:
controlling the isolation unit to completely disconnect the sense amplifier from the bit line and the complementary bit line; and
controlling the offset canceling signal to be valid in a period of completely disconnecting the sense amplifier from the bit line and the complementary bit line, such that at least the part of the stage of the charge sharing between the bit line and the memory cell or the complementary bit line and the second memory cell is performed at the same time as at least a part of a stage of an offset cancelling.

13. The method of reading out data according to claim 12, further comprising:
controlling the isolation unit to connect the sense amplifier with the bit line and the complementary bit line after the offset cancelling and the charge sharing are finished.

14. The method of reading out data according to claim 13, further comprising:
controlling a bit line restore signal to be valid, to perform a restoring operation on the bit line and a restoring operation on the complementary bit line respectively.

15. The method of reading out data according to claim 14, further comprising:
controlling a precharge signal to be valid, to precharge the sense amplifier.

\* \* \* \* \*